(12) United States Patent
Chang et al.

(10) Patent No.: US 7,456,090 B2
(45) Date of Patent: Nov. 25, 2008

(54) METHOD TO REDUCE UBM UNDERCUT

(75) Inventors: Blenny Chang, Kaohsiung (TW);
Hsiu-Mei Yu, Hsinchu (TW); Gil Huang, Hsinchu (TW); Sung-Cheng Chiu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 147 days.

(21) Appl. No.: 11/647,473

(22) Filed: Dec. 29, 2006

(65) Prior Publication Data

US 2008/0157362 A1   Jul. 3, 2008

(51) Int. Cl.
*H01L 21/44* (2006.01)
(52) U.S. Cl. .................. 438/613; 257/E21.508
(58) Field of Classification Search .......... 438/611, 438/612, 613
See application file for complete search history.

(56) References Cited

U.S. PATENT DOCUMENTS

| | | | |
|---|---|---|---|
| 6,372,545 B1 * | 4/2002 | Fan et al. ................. | 438/108 |
| 6,967,153 B2 * | 11/2005 | Tong et al. ................ | 438/613 |
| 7,015,130 B2 * | 3/2006 | Tsai et al. ................ | 438/613 |
| 2004/0259345 A1 * | 12/2004 | Yu et al. .................. | 438/613 |
| 2007/0117368 A1 * | 5/2007 | Tsai et al. ................ | 438/612 |

* cited by examiner

*Primary Examiner*—W. David Coleman
(74) *Attorney, Agent, or Firm*—Birch, Stewart, Kolasch & Birch, LLP

(57) ABSTRACT

A method of manufacturing a solder bump structure on a semiconductor device is provided. In one embodiment, a semiconductor substrate is provided having a bonding pad and a passivation layer formed thereabove, the passivation layer having an opening therein exposing a portion of the bonding pad. A first under bump metallization (UBM) layer is formed over the bonding pad and the passivation layer. A mask layer is placed over the first UBM layer, the mask layer having an opening therein exposing a portion of the first UBM layer. The mask layer is thereafter etched to create a recess at the edges between the first UBM layer and the mask layer. A second UBM layer is deposited in the opening of the mask layer, the second UBM layer filling the recess and a portion of the opening of the mask layer.

20 Claims, 5 Drawing Sheets

METHOD TO REDUCE UBM UNDERCUT

BACKGROUND

The present invention relates generally to the fabrication of semiconductor devices, and more particularly, to the fabrication of solder bump structures in the packaging of semiconductor devices.

Under bump metallization (UBM) structures are often utilized during semiconductor manufacturing processes. Semiconductor manufacturing processes generally begin with processes associated with fabricating a semiconductor wafer such as layering, patterning, doping, and heat treatments. Once fabricated, semiconductor wafers undergo additional processes associated with testing, packaging, and assembling semiconductor IC chips obtained from the wafers. Semiconductor manufacturing processes are continually being refined, modified, and improved in light of breakthroughs in semiconductor technology. One such technology that has continued to gain increased acceptance is "flip chip" technology, which refers to microelectronic assemblies in which direct electrical connections between face down, or flipped, chip components and outside components (e.g. substrates) are achieved through conductive bump or bonding pads formed on the chip.

Bonding pads in flip chips are typically manufactured to include a final metal layer, such as aluminum, to facilitate electrical communication from the IC chip. Flip chips are also manufactured to include solder bumps, which are deposited onto the bonding pads of such chips to physically and electrically connect the bonding pads with electrode terminals provided on packaging such as ceramic substrates, printed circuit boards, or carriers. Solder bumps are typically formed of a metal alloy such as a lead-tin alloy, and are often applied to semiconductor wafers prior to separation into individual semiconductor chips.

Solder bumps, however, are generally not applied directly to the bonding pads of the semiconductor wafer. It has been found that the direct application of solder bump material to the semiconductor wafer yields poor electrical conduction, due largely to the rapid oxidation of the final metal layer (e.g. aluminum) upon exposure to air. Moreover, aluminum has been found to be neither particularly wettable nor bondable with most solders. Accordingly, UBM structures and associated techniques have been developed to provide a low resistance electrical connection between the solder bump and the underlying bonding pad, while withstanding the various stresses associated with semiconductor applications.

UBM structures generally include one or more metallic layers, such as layers of titanium and of copper, deposited over the bonding pads of IC chips. In practice, solder is typically deposited over a UBM structure, and then heated via a reflow process to form a generally spherical solder bump. However, it has been found that prior art solder bump structures tend to suffer from poor reliability and performance due to the problem of undercutting in one or more of the UBM layers.

FIGS. 1A-1D illustrate this problem. FIG. 1A depicts a cross-sectional view of a conventional solder bump structure during a fabrication process, the structure containing the following:

2 is a semiconductor substrate over which the solder bump is to be formed.

4 is the bonding pad, which is to be brought into contact with the solder bump to be formed.

6 is a patterned passivation layer.

8A is a first UBM layer (e.g. titanium).

8B is a second UBM layer (e.g. copper).

10 is a mask layer (e.g. photoresist).

12 is an opening in the mask layer.

Typically, additional layers of UBM may be deposited in opening 12 of the mask layer 10. In FIG. 1B, additional layers of copper (8B) and nickel (8C) are deposited in opening 12 filling a portion of the mask layer 10. Following the removal of the mask layer 10 as shown in FIG. 1C, the UBM layers undergo an etching step, such as wet etching. First, nickel layer 8C is etched, then the copper layers 8B, and finally the adhesive titanium layer 8A. In wet etching, an isotropic etch profile is produced, in which the etching is at the same rate in all directions, leading to undercutting of the etched material. This action results in an undesirable loss of linewidth. In etching the copper layers 8B, an undercut 14 results as shown in FIG. 1D. Due to its thickness, the copper needs to be exposed to the etchant for a longer period resulting in an undercut. In etching the titanium layer 8A, an undercut 16 results. Copper undercut 14 may be as large as 6 µm per side and titanium undercut 16 may be as large as 4 µm per side, resulting in a total undercut of 10 µm per side of the solder bump structure. Although the undercut is an inherent result of the etching process, the undercut is detrimental to the long term reliability of the interconnection. The undercut compromises the integrity of the solder bump structure by weakening the bond between the solder bump and the bonding pad of the chip, thereby leading to premature failure of the chip.

For these reasons and other reasons that will become apparent upon reading the following detailed description, there is a need for a solder bump structure having improved reliability and performance that avoids the undercut problems associated with conventional solder bump structures.

SUMMARY

The present invention is directed to a method of manufacturing a solder bump structure on a semiconductor device. In one embodiment, a semiconductor substrate is provided having a bonding pad and a passivation layer formed thereabove, the passivation layer having an opening therein exposing a portion of the bonding pad. A first under bump metallization (UBM) layer is formed over the bonding pad and the passivation layer. A mask layer is placed over the first UBM layer, the mask layer having an opening therein exposing a portion of the first UBM layer. The mask layer is thereafter etched to create a recess at the edges between the first UBM layer and the mask layer. A second UBM layer is deposited in the opening of the mask layer, the second UBM layer filling the recess and a portion of the opening of the mask layer.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference will now be made in detail to the present preferred embodiments of the present invention, examples of which are illustrated in the accompanying drawings.

Figure 1A:
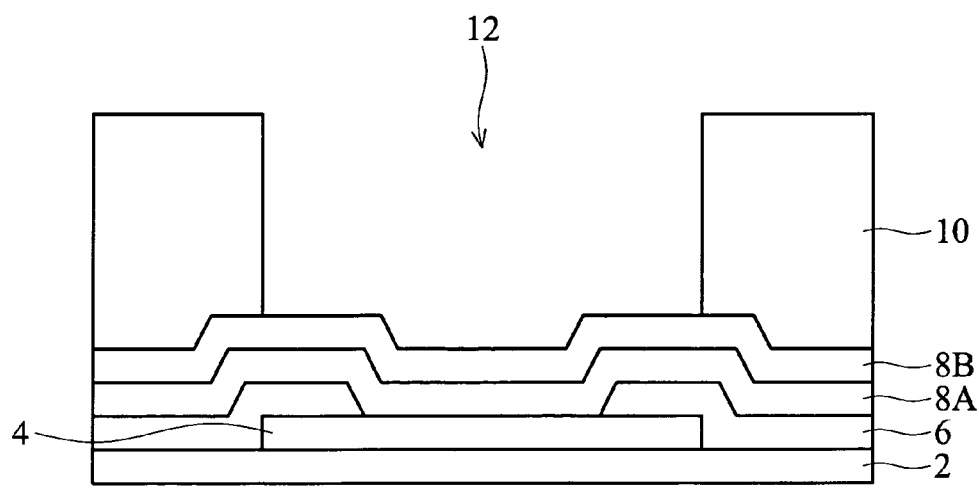
FIGS. 1A-1D are cross-sectional views of a semiconductor device depicting a prior art method of forming a solder bump structure.
Figure 1B:
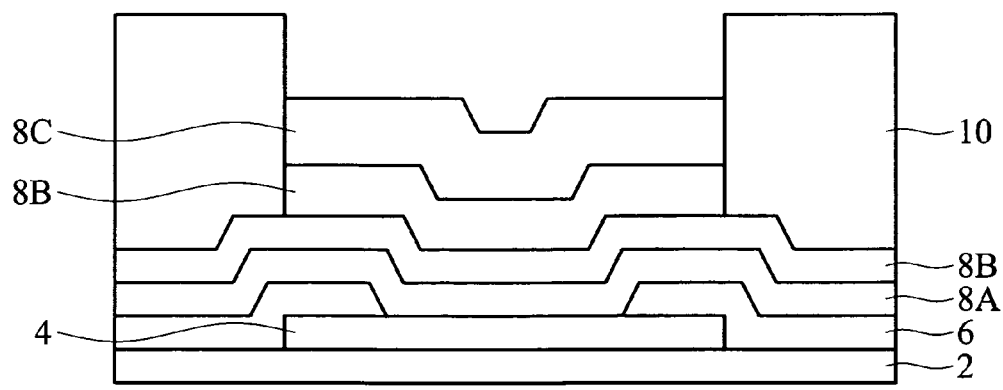
Figure 1C:
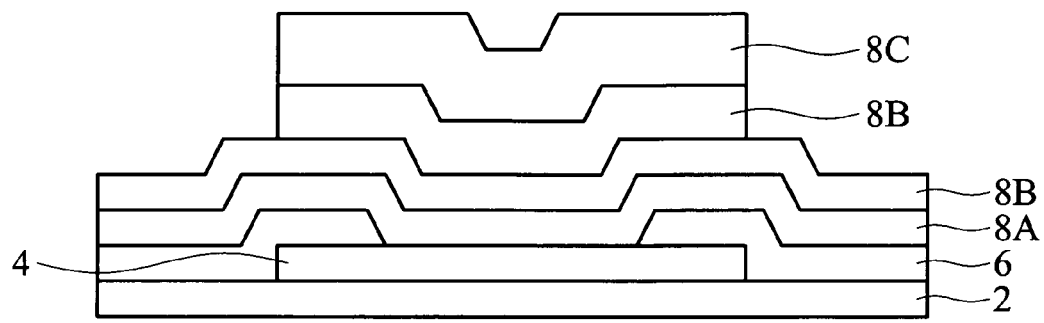
Figure 1D:
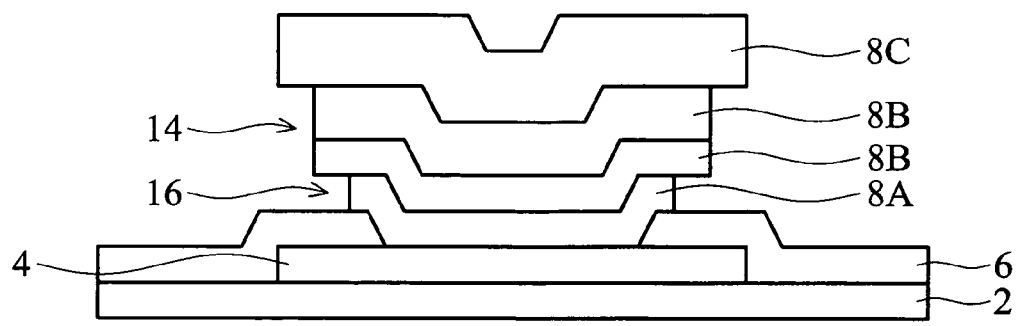
Figure 2A:
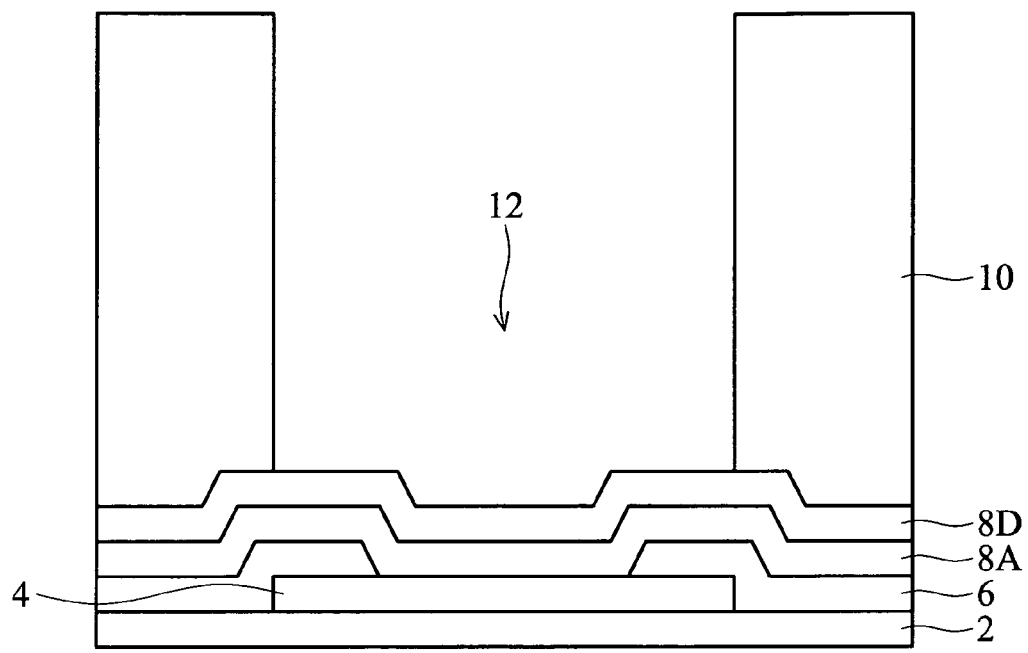
FIGS. 2A-2E are cross-sectional views of a semiconductor device depicting a method of forming a solder bump structure according to one embodiment of the present invention.

FIG. 2A is a cross-sectional view of a solder bump structure undergoing a step in a fabrication process, according to one embodiment of the present invention. The solder bump structure has a semiconductor substrate 2 having a bonding pad 4 and a passivation layer 6 formed thereabove, the passivation layer 6 having an opening therein exposing a portion of the bonding pad 4. Electrical contact to a chip is typically established by means of bonding pads or contact pads that form electrical interfaces with patterned levels of interconnecting metal lines. Bonding pad 4 may be formed by conventional vapor deposition (CVD) techniques and may be, for example copper, aluminum, or other conductive metals. After bonding pad 4 has been created on the surface of substrate 2, bonding pad 4 is then passivated and electrically insulated by the deposition of passivation layer 6 over the surface of bonding pad 4. The passivation layer generally insulates and protects the surface of the chip from moisture and other contaminants and also from mechanical damage during assembly of the chip. Passivation layer 6 may be deposited onto bonding pad 4 and substrate 2 using conventional CVD techniques and is thereafter patterned and etched to create an opening therein that aligns with bonding pad 4. The opening in passivation layer 6 over bonding pad 4 allows for subsequent electrical contact to a solder bump. Passivation layer 6 may comprise of silicon nitride (SiN), silicon dioxide ($SiO_2$), silicon oxynitride (SiON), and/or any other materials, and in one embodiment has a thickness of from about 1,000 Å to about 20,000 Å. In another embodiment of the present invention, various types of polyimides may also be deposited as a polyimide layer (not shown) over the passivation layer 6 to further protect the chip. The polyimide layer may be disposed adjacent to and in contact with the passivation layer 6, the bonding pad 4, and the first UBM layer 8A.

Typically, one or more under bump metallization (UBM) layers, of from about 500 Å to about 5,000 Å in thickness are then deposited over bonding pad 4 and passivation layer 6 by conventional processes such as electroplating or vapor deposition processes. UBM layers are typically formed over the bonding pad 4 to allow for better bonding and wetting of the solder material to the uppermost UBM layer adjacent to the solder material, and for protection of the bonding pad by the lowermost UBM layer. In one embodiment of the present invention, a first UBM layer 8A, comprising of titanium is formed over bonding pad 4 and passivation layer 6. First UBM layer 8A may have a thickness of from about 800 Å to about 1,000 Å. A second UBM layer 8D, comprising of copper is formed over first UBM layer 8A and may have a thickness of from about 3,000 Å to about 5,000 Å. A mask layer or photoresist layer 10 is thereafter formed over the UBM layers and in one embodiment, photoresist layer 10 is formed over second UBM layer 8D. Photoresist layer 10 is typically from about 10 to about 120 microns in height. As shown in FIG. 2A, photoresist layer 10 is photolithographically patterned and developed to form an opening 12 above bonding pad 4 to expose a portion of second UBM layer 8D.

Figure 2B:
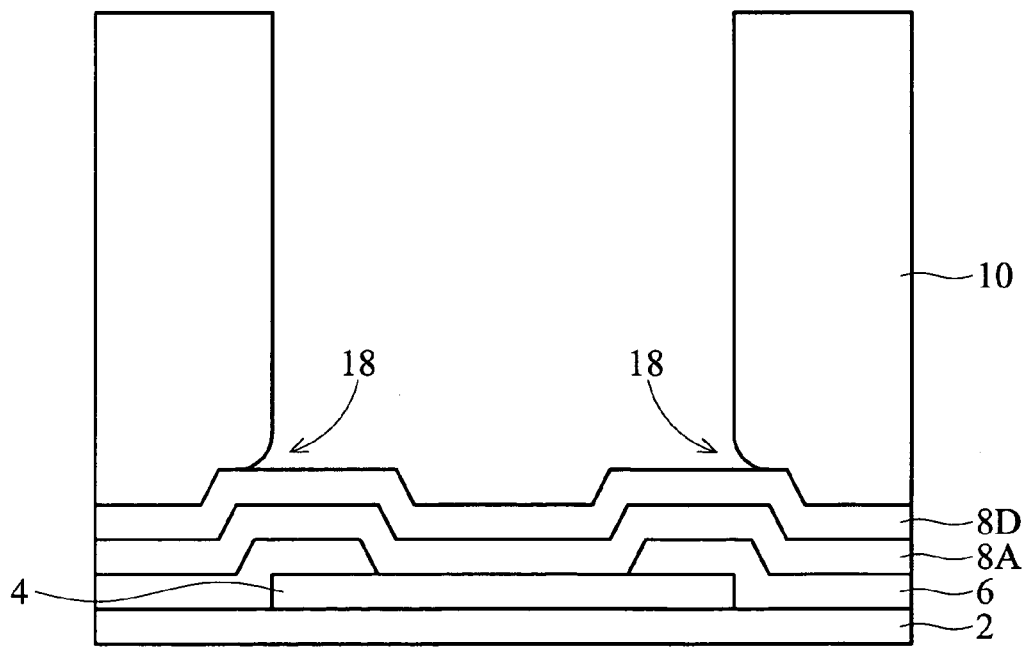

In an aspect of the present invention, the developed photoresist layer 10 is thereafter etched to selectively remove portions of the photoresist material to create a recess 18 at the edges or corners between the second UBM layer 8D and the photoresist layer 10, as shown in FIG. 2B. UBM layer 8D is not attacked significantly by the etchant. As will be explained later, the recess 18 is used to create a thicker footing for a subsequently-deposited UBM layer in the opening of the photoresist layer 10 in order to resist the etching of the UBM layer and therefore reduce undercutting. Various suitable etching methods are available in the art and may be used to form recess 18. For example, recess 18 may be formed by sputter etch, plasma etch, transformer coupled plasma (TCP), reactive ion etch (RIE), and/or any other processing techniques in an environment having chlorine, oxygen, argon, and/or any other chemicals. In one embodiment, the profile of recess 18 is formed at an etching rate larger than about 1500 A/min.

Figure 2C:
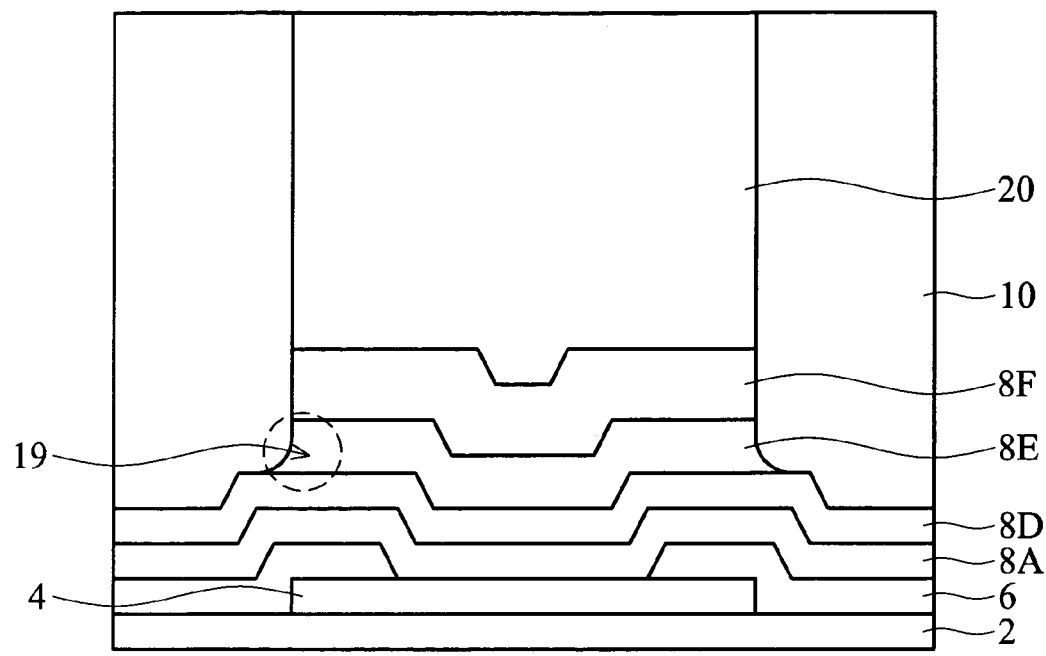

With reference now to FIG. 2C, additional UBM layers may be formed within opening 12 of photoresist layer 10 by, for example, an electroplating or vapor deposition process. In one embodiment of the present invention, a third UBM layer 8E and a fourth UBM layer 8F are formed in opening 12 and UBM layer 8E fills the recess 18 to form a footing 19. In one embodiment of the present invention, UBM layer 8E may be of from about 4 to about 5 microns in height and may be formed of copper and footing 19 may have a width of from about 3 to about 4 μm. UBM layer 8F may be of from about 2 to about 3 microns in height and may be formed of nickel. A column of solder material 20 may either be deposited in layers, for example, a layer of lead followed by a layer of tin, where the solder material layers are later formed into a homogeneous solder during a reflow (e.g. temporary melting) process for solder material. In other embodiments, the solder material may be deposited as a homogeneous solder material by vapor deposition or electroplating onto a "seed layer," such UBM layer 8F.

Figure 2D:
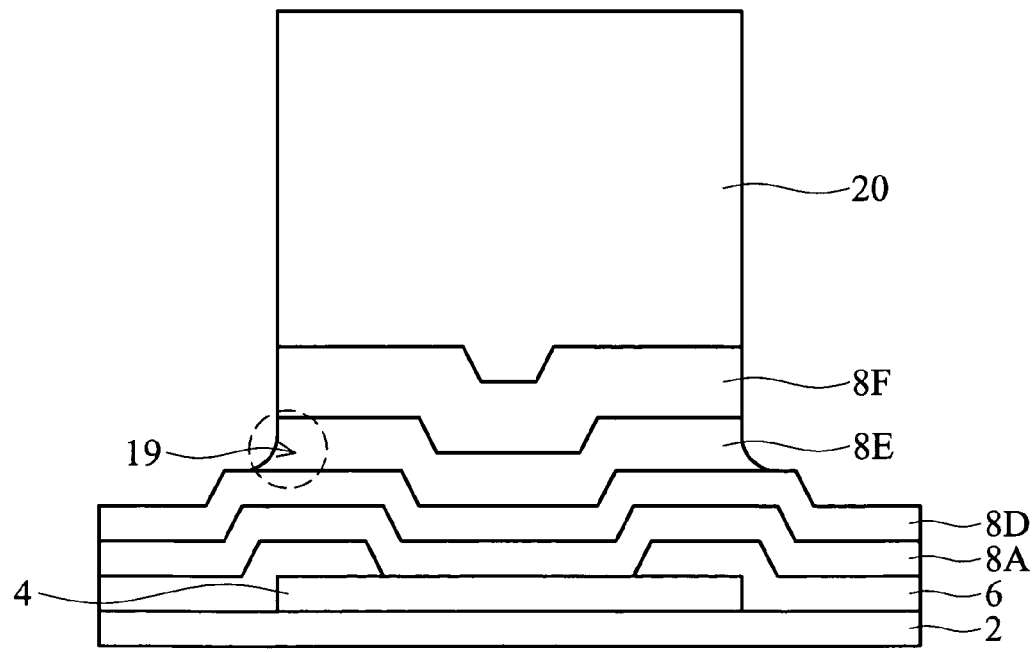
Figure 2E:
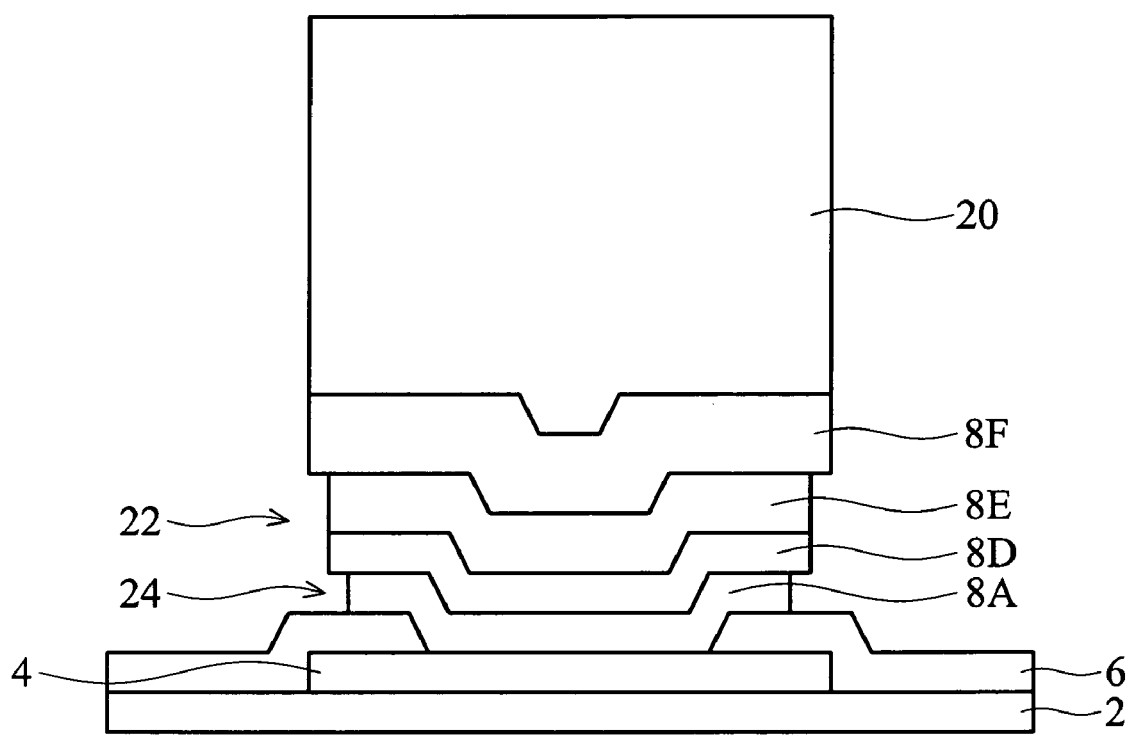

After removal of the photoresist layer 10, as shown in FIG. 2D, the UBM layers 8F, 8E, 8D, and 8A are subject to an etching process, such as, for example wet etching or reactive ion etch (RIE), to the underlying passivation layer 6 using the solder column 20 as an etching mask to protect the underlying UBM layers. However, due to the thick footing 19 on UBM layer 8E, UBM layers 8E, 8D, and 8A are better able to resist etching and therefore suffer from less undercutting than UBM layers formed by prior art methods. In one embodiment of the present invention, in wet etching UBM layers 8D and 8E (copper), an undercut 22 results. In wet etching the UBM layer 8A (titanium), an undercut 24 results. Copper undercut 22 may be about 3 μm per side and titanium undercut 24 may be about 2 μm per side, resulting in a total undercut of 5 μm per side of the solder bump structure. Although the undercut is an inherent result of the etching process, by employing the methodology of the present invention, the UBM layers suffer substantially less undercutting and therefore less cracks between UBM layers when compared to UBM layers fabricated by prior art methods. Accordingly, the reliability concerns associated with prior art methods of forming solder bump structures can be avoided.

Following the step of etching the UBM layers, the solder column 20 is then temporarily heated to a melting point ("reflow") such that surface tension effects create a substantially spherical solder bump (not shown) over UBM layer 8F.

The above described process for forming a solder bump structure is merely exemplary. Accordingly, the solder bump structure may be formed in a variety of manners, including processes other than photoresist processes, without departing from the scope of the disclosure. Also, although the UBM layer 8F is described as being formed of nickel, various other materials may be used in the formation of UBM layer 8F.

Layers such as the passivation layer and the polyimide layer may be altered or even removed without departing from the scope of the disclosure.

While various UBM structures and related methods for forming UBM structures during the solder bump formation process according to the principles disclosed herein have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

What is claimed is:

1. A method of manufacturing a solder bump structure on a semiconductor device, the method comprising:
   providing a semiconductor substrate having a bonding pad and a passivation layer formed thereabove, the passivation layer having an opening therein exposing a portion of the bonding pad;
   forming a first under bump metallization (UBM) layer over the bonding pad and the passivation layer;
   placing a mask layer over the first UBM layer, the mask layer having an opening therein exposing a portion of the first UBM layer;
   etching the mask layer to create a recess at the edges between the first UBM layer and the mask layer; and
   depositing a second UBM layer in the opening of the mask layer, the second UBM layer filling the recess and a portion of the opening of the mask layer.

2. The method of claim 1, wherein the first UBM layer comprises titanium.

3. The method of claim 1, wherein the first UBM layer comprises copper.

4. The method of claim 1, further comprising forming a polyimide layer disposed adjacent to and in contact with the passivation layer, the bonding pad, and the first UBM layer.

5. The method of claim 1, wherein the mask layer is a photoresist layer and the forming an opening in the mask layer comprises patterning and developing the photoresist layer.

6. The method of claim 1, wherein the second UBM layer comprises copper.

7. The method of claim 1, wherein the second UBM layer comprises nickel.

8. The method of claim 1, further comprising etching the second UBM layer such that the undercut of the second UBM layer is less than about 3 µm per side.

9. The method of claim 8, further comprising filling the opening of the mask layer with a solder material, removing the mask layer, and reflowing the solder material to form a solder bump.

10. A solder bump structure manufactured by the method of claim 9.

11. A method of manufacturing a solder bump structure on a semiconductor device, the method comprising:
    providing a semiconductor substrate having a bonding pad and a passivation layer formed thereabove, the passivation layer having an opening therein exposing a portion of the bonding pad;
    forming a first UBM layer over the bonding pad and the passivation layer;
    forming a second UBM layer over the first UBM layer;
    placing a mask layer over the second UBM layer, the mask layer having an opening therein exposing a portion of the second UBM layer;
    etching the mask layer to create a recess at the edges between the second UBM layer and the mask layer; and
    depositing a third UBM layer in the opening of the mask layer, the third UBM layer filling the recess and a portion of the opening of the mask layer.

12. The method of claim 11, wherein the first UBM layer is titanium.

13. The method of claim 11, wherein the second UBM layer is copper.

14. The method of claim 11, wherein the third UBM layer is copper.

15. The method of claim 11, further comprising forming a polyimide layer disposed adjacent to and in contact with the passivation layer, the bonding pad, and the first UBM layer.

16. The method of claim 11, further comprising depositing a fourth UBM layer above the third UBM layer in the opening of the mask layer.

17. The method of claim 11, further comprising etching the first, second, and third UBM layers such that the undercut of the first UBM layer is less than about 2 µm per side and the undercuts of the second and third UBM layers are less than about 3 µm per side.

18. The method of claim 16, wherein the fourth UBM layer is nickel.

19. The method of claim 17, further comprising filling the opening of the mask layer with a solder material, removing the mask layer, and reflowing the solder material to form a solder bump.

20. A solder bump structure manufactured by the method of claim 19.

* * * * *